US006281699B1

(12) United States Patent
Bishop

(10) Patent No.: US 6,281,699 B1
(45) Date of Patent: Aug. 28, 2001

(54) DETECTOR WITH COMMON MODE COMPARATOR FOR AUTOMATIC TEST EQUIPMENT

(75) Inventor: Charles D. Bishop, Wrentham, MA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/525,557

(22) Filed: Mar. 15, 2000

(51) Int. Cl.[7] .............................. G01R 31/26; H03K 5/22

(52) U.S. Cl. .......................... 324/765; 324/158.1; 327/68

(58) Field of Search ................................ 324/765, 158.1; 714/736; 327/68; 702/64

(56) References Cited

U.S. PATENT DOCUMENTS

| | | | |
|---|---|---|---|
| 4,659,997 | 4/1987 | Ferland et al. | 330/257 |
| 4,782,290 * | 11/1988 | Sakai et al. | 324/765 |
| 4,818,934 * | 4/1989 | Tamamura et al. | 324/765 |
| 4,885,528 * | 12/1989 | Tanaka et al. | 324/713 |
| 5,210,527 * | 5/1993 | Smith et al. | 340/659 |
| 5,579,236 * | 11/1996 | Tamamura et al. | 702/64 |
| 5,760,599 * | 6/1998 | Ehiro | 324/765 |
| 5,970,074 * | 10/1999 | Ehiro | 714/745 |
| 6,016,566 | 1/2000 | Yoshida | 714/736 |
| 6,215,324 * | 1/2000 | Yoshida | 324/760 |

OTHER PUBLICATIONS

Web document: "Fusion Focus", downloaded Oct. 12, 1999 from http://www.ltx.com and http://www.ltx.com/products/hiperdif.html.

* cited by examiner

*Primary Examiner*—Glenn W. Brown
*Assistant Examiner*—Wasseem H. Hamdan
(74) *Attorney, Agent, or Firm*—Bruce D. Rubenstein

(57) ABSTRACT

A detector circuit for automatic test equipment samples and tests differential signals. The detector circuit includes a pair of impedances connected in series between first and second legs of a differential input signal. A signal is formed at the junction of the two impedances that equals the common mode voltage of the differential signal. The common mode signal is coupled to the input of a window comparator, which compares the common mode signal with predetermined thresholds. The window comparator generates an output indicative of whether the common mode signal is above, within, or below the predetermined thresholds. Using this approach, the detector circuit can detect errors in differential signals caused by mismatched amplitudes or by timing skew between the first and second input signals. According to one feature, the detector circuit also includes a differential mode detector that receives the first and second input signals. The detector circuit according to the invention thus separately extracts the common mode and differential components of a differential input signal for separate evaluation.

18 Claims, 2 Drawing Sheets

DETECTOR WITH COMMON MODE COMPARATOR FOR AUTOMATIC TEST EQUIPMENT

This invention relates generally to detector circuits for automatic test equipment, and more particularly to digital detector circuits for receiving differential signals from a device under test (DUT).

BACKGROUND OF THE INVENTION

Automatic test equipment (ATE) plays a significant role in the manufacture of semiconductor devices. Manufacturers generally use automatic test equipment—or "testers"—to verify the operation of semiconductor devices at the wafer and packaged device stages of semiconductor manufacturing processes. By testing semiconductor devices at these stages, manufacturers are able to reject defective devices early in the manufacturing process. Early detection of faults eliminates costs that would otherwise be incurred by processing defective parts, and thus reduces the overall costs of manufacturing. Manufacturers also use ATE to grade various specifications of devices. Devices can be tested and categorized within different bins that correspond to different levels of performance in significant areas, for example, speed. Parts can then be labeled and sold according to their levels of performance.

A tester generally includes a host computer that runs software for controlling various tests of the semiconductor devices. The software prescribes signal characteristics for applying stimuli to the DUT (device under test) and for sampling responses from the DUT. A pattern generator translates the signal characteristics into timing signals. Specialized circuitry called pin electronics then converts the timing signals into actual stimuli and timing windows.

Pin electronics are generally grouped among different circuits of the ATE called "channels." The channels provide a signal interface between the tester and the DUT. Each channel typically includes a driver circuit and a detector circuit. The present invention pertains to a new type of detector circuit for use in pin electronics channels of ATE.

Detector circuits are used in automatic test equipment to sample digital signals generated by a device under test. FIG. 1 illustrates a highly simplified ATE system. As shown in FIG. 1, a host computer 118 runs a test program for testing a DUT 122 via a plurality of digital channels, shown generally as channels 110*a*–110*e*.

Each of the plurality of channels 110*a*–110*e* has an I/O terminal, respectively 120*a*–120*e*, that can be coupled to the DUT 122. Each channel typically includes a driver circuit 112, a detector circuit 114, and channel overhead circuitry 116. The channel overhead circuitry 116 typically includes digital-to-analog converters (DACs) for establishing drive levels for the driver circuit 112 and for establishing detect levels for the detector circuit 114. The channel overhead circuitry 116 typically also controls the driver circuit 112 to apply signal edges at precise instants in time, and controls the detector circuit 114 to sample input signals at precise instants in time. The channel overhead circuitry 116 may also include memory for storing digital patterns to be applied to the DUT by the driver circuit 112 and for storing digital states sampled by the detector circuit 114.

Traditionally, the role of detector circuits in ATE has been for sampling single-ended signals, i.e., for determining whether a single-ended digital signal is in a high logic state, a low logic state, or a logic state between high and low (a "between" state). We have recognized, however, that there is also a need for sampling differential signals. In contrast with single-ended signals, which provide one signal for conveying a digital logic state with reference to a digital ground, differential signals convey digital logic states as differences between two signals, neither one of which is digital ground.

Rapidly developing technologies such as IEEE 1324 (Firewire) and LVDS (Low Voltage Differential Signaling) extensively use differential digital communication. These technologies impose strict specifications on differential signals. A need has arisen, therefore, for testing the specifications of differential digital signals using ATE.

SUMMARY OF THE INVENTION

With the foregoing background in mind, it is an object of the invention to test differential digital signals effectively and accurately.

To achieve the foregoing object and other objectives and advantages, a detector circuit for sampling digital signals from a device under test receives first and second differential input signals. The first and second differential input signals are coupled through respective impedances to an input of a measurement device. The measurement device generates an output indicative of whether the signal at the input of the measurement device is within a predetermined range.

According to one feature, the detector circuit also includes a differential detector having first and second inputs respectively receiving the first and second differential input signals. The differential detector generates an output indicative of whether a difference between the first and second differential input signals is within another predetermined range.

Additional objects, advantages, and novel features of the invention will become apparent from a consideration of the ensuing description and drawings.

BRIEF DESCRIPTION OF THE DRAWINGS

The invention will be better understood with reference to the accompanying drawings, in which aspects of the prior art and the invention are illustrated as follows.

DESCRIPTION OF THE PREFERRED EMBODIMENT

Topology and Operation

Figure 1:
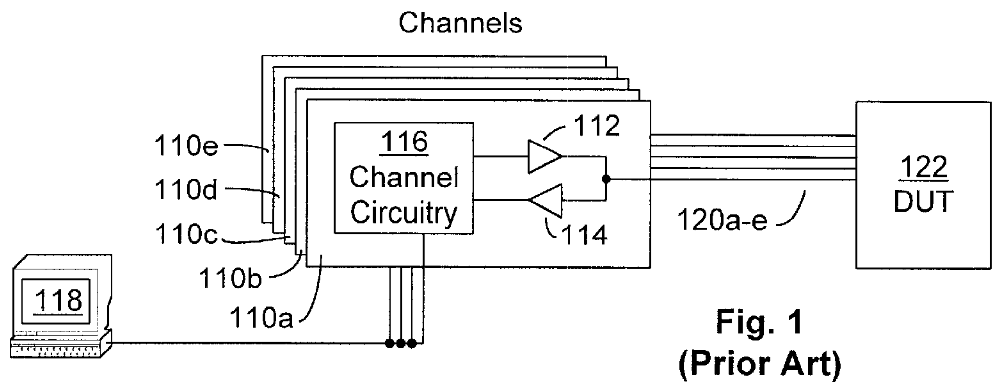
FIG. 1 is a partial block diagram of an ATE system that uses detector circuits to sample single-ended signals from a device under test, according the prior art.
Figure 2:
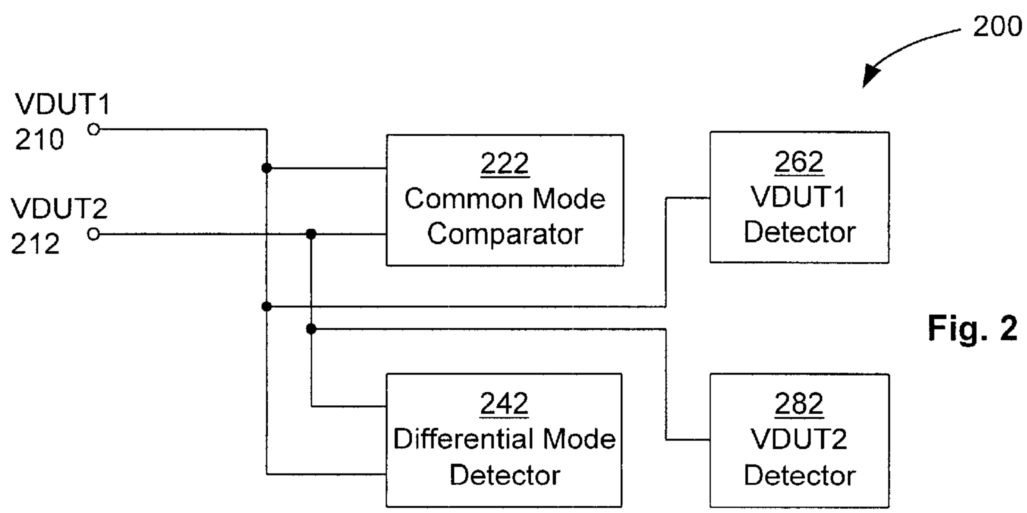
FIG. 2 is a partial schematic of a detector circuit according to the invention.

FIG. 2 illustrates an embodiment 200 of a detector circuit according to the invention. As shown in FIG. 2, a differential input signal comprising first and second input signals VDUT1 and VDUT2 from nodes 210 and 212 is provided to the inputs of a common mode comparator 222. The common mode comparator 222 derives the common mode voltage of the differential pair VDUT1 and VDUT2, independently of the differential voltage between VDUT1 and VDUT2, and compares the common mode voltage with predetermined thresholds.

The first and second input signals VDUT1 and VDUT2 are also provided to the inputs of a differential mode comparator 242. The differential mode comparator 242 derives the differential voltage between VDUT1 and VDUT2, independent of the common mode voltage, and compares the differential voltage against another set of predetermined thresholds.

The first input signal VDUT1 is also provided to the input of a high-side window comparator 262. The high-side window comparator 262 compares VDUT1 against predetermined high and low threshold voltages. In addition, the second input signal VDUT2 is provided to the input of a low-side window comparator 282. The low-side window comparator 282 compares VDUT2 against yet another pair of predetermined threshold voltages.

Figure 3:
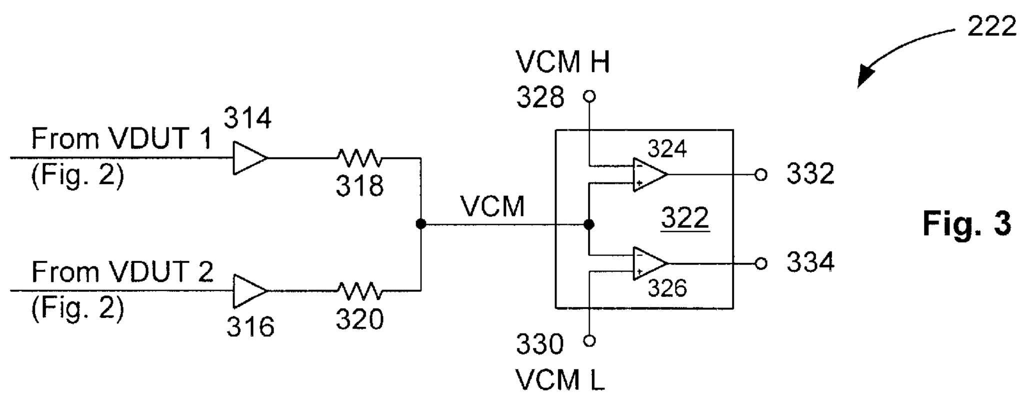
FIG. 3 is a more detailed partial schematic of the common mode comparator of FIG. 2.

FIG. 3 is a more detailed illustration of the common mode comparator 222. As shown in FIG. 3, the common mode comparator 222 includes first and second impedances 318 and 320, each having first and second nodes. The first node of the first impedance 318 is coupled to the first input node 210 of the detector circuit 200, for receiving the first input signal VDUT1. The first node of the second impedance 320 is coupled to the second input node 212 of the detector circuit 200 for receiving the second input signal VDUT2. Preferably, buffers 314 and 316 are included in the common mode comparator 222 to reduce loading effects upon input signals from the DUT. The second nodes of the impedances 318 and 320 are coupled together at a common junction. In the preferred embodiment, the first and second impedances 318 and 320 have substantially equal values of impedance. Therefore, the common junction between the first and second impedances 318 and 320 conveys a signal "VCM" that substantially equals the midpoint of the first and second input signals VDUT1 and VDUT2. The common junction is in turn coupled to an input of a measurement device, for example a common mode window comparator 322. The common mode window comparator 322 generates an output indicative of whether the signal VCM at the common junction is within or outside a pair of predetermined threshold levels. The common mode window comparator 322 thus verifies whether the common mode voltage of the differential input signal is within predetermined limits.

The common mode window comparator 322 preferably includes a first comparator 324 and a second comparator 326. The first comparator 324 receives the signal VCM at the common junction at its non-inverting input and receives a high threshold level VCM H (node 328) at its inverting input. The first comparator 324 thus generates a high logic level at its output 332 in response to the signal at the common junction crossing the high threshold level VCM H in a positive direction. The first comparator 324 also generates a low logic level at its output 332 in response to the signal at the common junction crossing the high threshold level VCM H in a negative direction.

The second comparator 326 receives the signal VCM at the common junction at its inverting input and receives a low threshold level VCM L (node 330) at its non-inverting input. The second comparator 326 thus generates a high logic level at its output 334 in response to the signal at the common junction crossing the low threshold level VCM L in a negative direction. The second comparator 326 also generates a low logic level at its output 334 in response to the signal at the common junction crossing the low threshold level VCM L in a positive direction.

The outputs 332 and 334 of the first and second comparators 324 and 326 couple to channel circuitry (not shown), which samples the output states of the comparators 324 and 326 at predetermined instants in time and stores the results. A test program running on the host computer then reads the stored results and takes appropriate action. For example, the test program can cause a test to fail if the outputs 332 and 334 of the comparators 324 and 326 indicate that the common mode signal VCM is outside the range between VCM H and VCM L. The threshold values VCM H and VCM L are generally prescribed by the test program and are established by programming DACs within the channel overhead circuitry, in the manner described above.

Thus described, the detector circuit 200 separately extracts and tests the common mode component of the differential input signal, via impedances 318 and 320, and via the common mode window comparator 322. The detector circuit 200 also separately extracts and tests the differential voltage of the differential input signal, via differential mode detector 242. Moreover, the detector circuit 200 separately extracts and tests each of the individual signals that constitute the differential input signal, via the high and low-side window comparators 262 and 282. The detector circuit 200 thus resolves a differential input signal into separately identifiable components and tests each component separately.

Hardware Implementation

The detector circuit 200 is preferably implemented within an Application-Specific Integrated Circuit (ASIC). The ASIC preferably employs a combination of CMOS and bipolar transistors. The first and second impedances 318 and 320 are preferably resistors fabricated within the ASIC. It will be apparent to those skilled in the art, however, that the circuit technology used for the detector circuit 200 could be varied substantially within the scope of the invention.

Waveforms of the Detector Circuit

Figure 4:
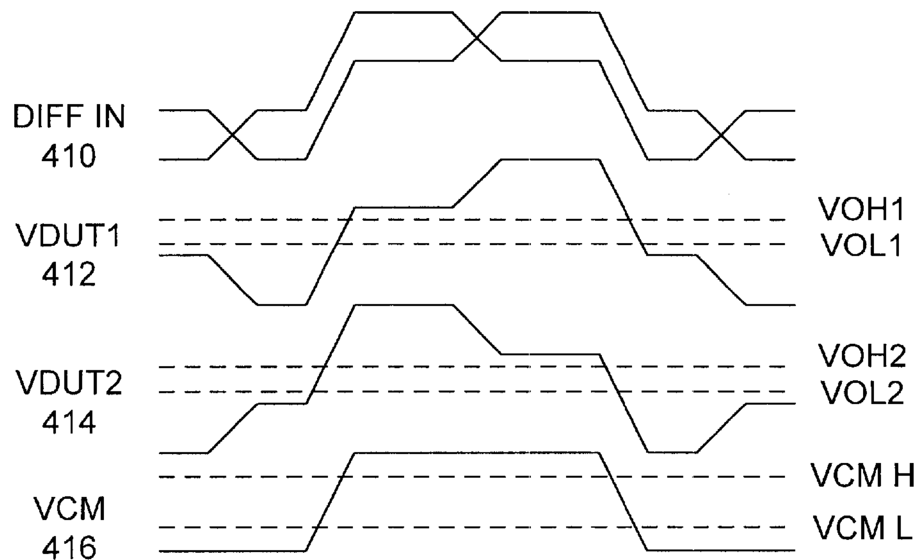
FIG. 4 is a timing diagram that shows waveforms of the detector circuit of FIGS. 2 and 3.

FIG. 4 illustrates a differential signal 410, as it may appear between the input nodes 210 and 212 of the detector circuit 200 of FIG. 2. The differential signal 410 undergoes a change of state while operating at a first common mode level, shifts to a second common mode level, where it undergoes a second change of state, and returns to the first common mode level, where it undergoes yet a third change of state.

The detector circuit 200 separates the differential signal 410 into separate components, each of which may be individually tested. Waveforms 412 and 414 represent the first and second input signals VDUT1 and VDUT2 that constitute the differential input signal 410. The first input signal VDUT1 may be compared against high and low thresholds within the high-side window comparator 262. The second input signal VDUT2 may be compared against high and low thresholds within the low-side window comparator 282. The high and low-side window comparators 262 and 282 can be sampled at any instant in time to capture the instantaneous state of the input signals VDUT1 and VDUT2 with reference to their respective thresholds. Moreover, the threshold levels of the high and low-side window comparators 262 and 282 can be adjusted over a wide range to flexibly detect different characteristics of the input signals VDUT1 and VDUT2.

Waveform 416 is an illustration of the common mode signal VCM as it appears at the input of the first window comparator 322. The VCM signal represents the midpoint of the input signals VDUT1 and VDUT2 as a function of time. As changes in the differential state of VDUT1 and VDUT2 have no effect on the midpoint, i.e., on the common mode voltage, waveform 416 remains constant throughout the three differential logic transitions. When the differential input signal 410 shifts in common mode, however, the common mode signal 416 shifts correspondingly.

The common mode window comparator 322 compares the common mode signal VCM (waveform 416) with high and low threshold levels VCM H and VCM L. At any instant in time, the signal VCM can be sampled to determine its instantaneous level with respect to the thresholds VCM H and VCM L.

Testing Differential Signals

The detector circuit 200 can be used to test a variety of characteristics of differential input signals. For example, the detector circuit 200 can be used to test whether the constituent signals of a differential signal pair have the same amplitude. Amplitude errors are common in differential circuits in which the individual signals are subject to different loading, for example, where one side of a differential driver has a damaged output stage, or where different sides of a differential driver circuit are differently constructed. Different differential receivers have different tolerances for this type of error. Some circuits malfunction when the imbalance becomes too great.

Figure 5:
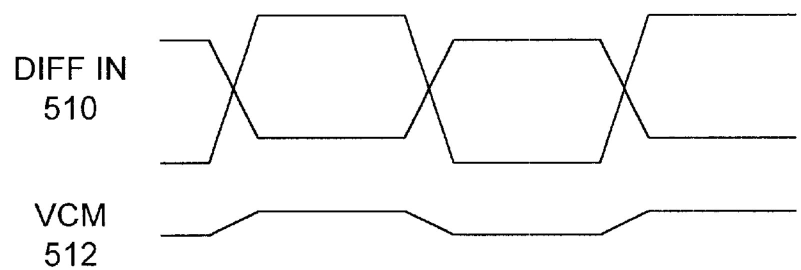
FIG. 5 is a timing diagram that shows the response of the detector circuit of FIGS. 2 and 3 to a differential signal, wherein the individual signals that comprise the differential signal have different amplitudes.

FIG. 5 illustrates waveforms of the detector circuit 200 as they may appear during a test for mismatched amplitudes. Waveform 510 illustrates a differential input signal between the input nodes 210 and 212 of the detector circuit 200 of FIG. 2. Compared with an ideal differential input signal, the actual differential input signal 510 is composed of individual signals that have slightly different amplitudes.

The detector circuit 200 reveals the imbalance in the amplitudes of the input signals. Because the midpoint 512 (VCM) of the imbalanced differential signal 510 changes between different phases of the differential input signal 510, the common mode signal 512 manifests the unequal amplitudes in the form of an AC component. By setting the threshold levels VCM H and VCM L to appropriate levels, a test program can detect varying levels of mismatched amplitudes.

Figure 6:
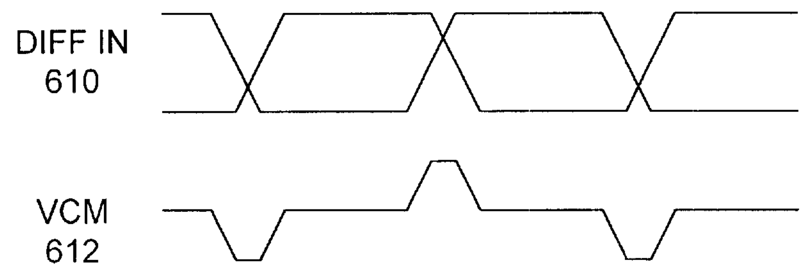
FIG. 6 is a timing diagram that shows the response of the detector circuit of FIGS. 2 and 3 to a differential signal, wherein the individual signals that comprise the differential signal have timing skew between them.

FIG. 6 illustrates another example of a test that the detector circuit 200 can perform, for detecting timing skew between the individual signals of a differential input signal. Timing skew can arise for a number of reasons, for example, because of damaged output stages, different loading of the individual signals, and different path lengths of the individual signals.

In contrast with an ideal differential signal, the actual differential input signal 610 consists of individual signals that have timing skew between them—edges of the individual signals do not perfectly align in time.

The detector circuit 200 reveals this timing skew. As shown in FIG. 6, the timing skew causes the midpoint VCM of the differential input signal 612 to undergo brief spikes whenever differential transitions of the differential input signal 610 occur. The amplitude of these spikes corresponds to the amount of timing skew present. Thus, while small levels of timing skew cause short spikes to occur, larger values of timing skew cause taller spikes. By appropriately setting the threshold levels VCM H and VCM L, a test program can detect varying levels of timing skew.

Detecting timing skew and mismatched amplitudes of differential signals is particularly valuable in low-noise applications. By carefully routing individual signals of a differential pair side-by-side at close spacing, circuit board designers can cause electromagnetic noise emitted by the individual signals of a differential pair to substantially cancel. Mismatched amplitudes and timing skew prevent total cancellation, however, by inducing a common mode signal that cannot be eradicated by using careful circuit layout. A particular advantage of the present invention is therefore its ability to detect these noise-inducing errors of differential signals.

Optionally, the detector circuit 200 may be equipped with a selectable filter (not shown) for filtering the common mode voltage VCM. As indicated above, timing skew induces high-frequency spikes in the common mode voltage VCM. By comparison, mismatched amplitudes induce much slower frequency components. Common mode errors caused by timing skew can be distinguished from common mode errors caused by mismatched amplitudes by low-pass filtering the common mode signal VCM over the frequency range in which the high frequency spikes occur. If the error in VCM vanishes when the low-pass filter is engaged, the error is most likely caused by timing skew. If it does not vanish, the error is most likely caused by mismatched amplitude. Alternatively, a high-pass filter can be used to pass the high-frequency spikes and attenuate the more gradual changes due to mismatched amplitude.

Alternatives

Having described one embodiment, numerous alternative embodiments or variations can be made. For example, the first and second impedances 218 and 220 are shown in FIG. 2 as resistors. This is merely an example of one way in which the first and second impedances may be implemented. Alternatively, other passive components, or combinations of passive components can be used. Active components can be used, as well as combinations of active components and passive components. According to yet another alternative, no physically distinct impedances need to be provided, in situations where sufficient impedance is inherent in the connections between components.

In addition, the common mode window comparator 322 is pictured and described as including a pair of comparators arranged in a particular manner. Those skilled in the art would realize, however, that this is merely one way of constructing a window comparator. Window comparators could be arranged in different ways within the scope of the invention.

Moreover, a window comparator is but one example of suitable measurement device that can be used in accordance with the invention. Alternatively, other types of measurement devices can be used, such as analog-to-digital converters, digitizers, or samplers.

As described above, channel circuitry samples the outputs of the window comparator at predetermined instants of time, and stores the resulting sampled signals. However, this is merely one example of how output signals from the window comparator can be processed according to the invention. According to another example, the channel circuitry includes latching circuitry for holding the output states of the window comparator once a threshold level is crossed. The host computer, or another processor, can then read the latching circuitry to determine whether a threshold has been crossed at any time during a preceding interval. The latching circuitry thus eliminates the need for sampling the window comparator at exact instants in time. As a variant on this alternative, peak detectors can be placed in series with the signal path of the common mode signal to hold its maximum or minimum value, thereby facilitating the detection of transient events.

A particularly attractive alternative aspect of the invention is its application to Firewire (IEEE 1394). According to the Firewire specification, the common mode voltage of a differential signal encodes a particular characteristics of a signal, for example, its transmission speed. The ability of the present invention to separately extract and measure common mode voltage independently of differential voltage allows for easy testing of these characteristics. This ability of the common mode detector to separately measure common mode voltage can be easily extended to other technologies in which the common mode component of a differential signal encodes meaningful information.

It should be understood, therefore, that the invention may be practiced in a variety of different ways, and should be limited only by the spirit and scope of the appended claims.

What is claimed is:

1. A detector circuit for measuring differential digital signals from a device under test (DUT) in an automatic test system, comprising:

a first input node receiving a first input signal of a differential signal pair;

a second input node receiving a second input signal of the differential pair;

an input circuit having first and second inputs coupled to the first and second input nodes, and an output generating an output signal indicative of a common mode voltage of the differential pair; and a measurement device having an input coupled to the output of the input circuit, and generating an output indicative of whether the common mode voltage is at least one of greater than a low common mode threshold and less than a high common mode threshold.

2. A detector circuit as recited in claim 1, wherein the first and second input nodes are coupled, via the input circuit, to the input of the measurement device with impedances.

3. A detector circuit as recited in claim 2, wherein the first and second impedances have substantially equal values of impedance.

4. A detector circuit as recited in claim 3, wherein the first and second impedances are resistors having substantially equal values of resistance.

5. A detector circuit as recited in claim 1, wherein the input circuit comprises:

a first input buffer coupled in series with the first node of the first impedance; and a second input buffer coupled in series with the second node of the second impedance.

6. A detector circuit as recited in claim 1, wherein the measurement device is a window comparator comprising:

a first comparator having a first input coupled to the output of the input circuit and a second input receiving a high common mode threshold level; and a second comparator having a first input coupled to the output of the input circuit and a second input receiving a low common mode threshold level.

7. A detector circuit as recited in claim 6, wherein the window comparator has at least two output signals, the at least two output signals together being indicative of the output signal of the input circuit being above the high common mode threshold, being below the low common mode threshold, and being between the high common mode threshold and the low common mode threshold.

8. A detector circuit as recited in claim 1, wherein the measurement device is a first measurement device and the predetermined range is a first predetermined range, and further comprising:

a differential mode detector having first and second inputs and an output, the first and second inputs of the differential circuit respectively receiving the first and second input signals, the differential mode detector generating an output indicative of whether the difference between the first and second input signals is within a second predetermined range.

9. A detector circuit as recited in claim 1, further comprising:

first and second single-ended detectors respectively coupled to the first and second input nodes, the first single-ended detector generating an output indicative of whether the first input signal is within one predetermined range, and the second single-ended detector generating an output indicative of whether the second input signal is within another predetermined range.

10. A detector circuit as recited in claim 1, wherein the predetermined range is a first predetermined range, and further comprising:

a differential mode detector having first and second inputs respectively coupled to the first and second input nodes, the differential mode detector generating an output indicative of whether a difference between the first and second input signals is within a second predetermined range; and first and second single-ended detectors respectively coupled to the first and second input nodes, the first single-ended detector generating an output indicative of whether the first input signal is within a third predetermined range, and the second single-ended detector generating an output indicative of whether the second input signal is within a fourth predetermined range.

11. A detector circuit as recited in claim 1, used in an automatic test system that includes multiple copies of the detector circuit.

12. A method of testing a differential input signal in an automatic test system, comprising:

(A) generating a midpoint signal level of the differential input signal indicative of a common mode voltage of the differential input signal;

(B) comparing the midpoint signal level with at least one of a high common mode threshold level and a low common mode threshold level;

(C) verifying that the midpoint signal level is at least one of below the high common mode threshold and above the low common mode threshold; and (D) reporting, responsive to step C of verifying, one of a pass and a fail result.

13. A method as recited in claim 12, wherein first and second input signals constitute the differential signal, and the step (a) of generating includes coupling together the first and second input signals through a pair of series-connected impedances, wherein a common junction formed between the pair of series-connected impedances provides the midpoint signal level.

14. A method as recited in claim 12, wherein first and second input signals constitute the differential signal, and further comprising:

low-pass filtering the midpoint signal level to distinguish common mode errors caused by timing skew between the first and second input signals from common mode errors caused by differences in amplitude between the first and second input signals.

15. A method as recited in claim 12, wherein and second input signals constitute the differential signal, and further comprising:

setting the high and low common mode threshold levels based upon a predetermined timing skrew between the first and second input signals.

16. A method as recited in claim 12, wherein first and second input signals constitute the differential signal, and further comprising:

setting the high and low common mode threshold levels based upon a predetermined mismatch error in the amplitudes of the fist and second input signals.

17. A method as recited in claim 13, wherein first and second input signals constitute the differential signal, and further comprising:

comparing the first input signal with at least one threshold level for the first input signal; and reporting one of a passing and failing result responsive to the relative levels of the first input signal and the at least one threshold level.

18. A method as recited in claim 12, used to test integrated circuits, and further comprising packaging the integrated circuits for which the step of reporting yields a passing result.

* * * * *